(12) United States Patent
Hao et al.

(10) Patent No.: US 11,929,446 B2
(45) Date of Patent: Mar. 12, 2024

(54) DETECTOR MATERIAL AND PREPARATION METHOD THEREOF

(71) Applicant: CHANGCHUN UNIVERSITY OF SCIENCE AND TECHNOLOGY, Changchun (CN)

(72) Inventors: Qun Hao, Changchun (CN); Zhipeng Wei, Changchun (CN); Jilong Tang, Changchun (CN); Huimin Jia, Changchun (CN); Lei Liao, Changchun (CN); Kexue Li, Changchun (CN); Fengyuan Lin, Changchun (CN); Rui Chen, Shenzhen (CN); Shichen Su, Guangzhou (CN); Shuangpeng Wang, Changchun (CN)

(73) Assignee: CHANGCHUN UNIVERSITY OF SCIENCE AND TECHNOLOGY, Changchun (CN)

( * ) Notice: Subject to any disclaimer, the term of this patent is extended or adjusted under 35 U.S.C. 154(b) by 0 days.

(21) Appl. No.: 18/033,637

(22) PCT Filed: Nov. 8, 2022

(86) PCT No.: PCT/CN2022/130475
§ 371 (c)(1),
(2) Date: Apr. 25, 2023

(87) PCT Pub. No.: WO2023/124547
PCT Pub. Date: Jul. 6, 2023

(65) Prior Publication Data
US 2023/0395743 A1    Dec. 7, 2023

(30) Foreign Application Priority Data

Dec. 30, 2021 (CN) .......................... 202111658225.2

(51) Int. Cl.
*H01L 31/18* (2006.01)
*H01L 31/0304* (2006.01)
(Continued)

(52) U.S. Cl.
CPC ...... *H01L 31/1844* (2013.01); *H01L 31/0304* (2013.01); *H01L 31/03046* (2013.01);
(Continued)

(58) Field of Classification Search
CPC .......... H01L 31/1844; H01L 31/03046; H01L 31/035236; H01L 31/0352
See application file for complete search history.

(56) References Cited

U.S. PATENT DOCUMENTS

| 5,953,359 A | * | 9/1999 | Yamaguchi | ............... H01S 5/12 |
| | | | | 372/50.12 |
| 2003/0008426 A1 | * | 1/2003 | Kise | .......................... H01S 5/12 |
| | | | | 438/22 |

(Continued)

FOREIGN PATENT DOCUMENTS

| CN | 106206297 | 12/2016 |
| CN | 113809192 | 12/2021 |
| CN | 114300580 | 4/2022 |

*Primary Examiner* — Ahmed N Sefer
(74) *Attorney, Agent, or Firm* — Fish IP Law, LLP

(57) ABSTRACT

Provided is a preparation method of a detector material. The present disclosure epitaxially grows a buffer layer on a surface of a gallium arsenide substrate, deposits a silicon dioxide layer on the buffer layer, and etches the silicon dioxide layer on the buffer layer according to a strip pattern by photolithography and etching to form strip growth regions with continuous changes in width. Finally, a molecular beam epitaxy (MBE) technology is used to epitaxially grow the detector material in the strip growth regions under set epitaxy growth conditions. Because of the same mobility of atoms arriving at the surface of the substrate, numbers of atoms migrating to the strip growth regions are different due (Continued)

to different widths of the strip growth regions, such that compositions of the material change with the widths of the strip growth regions or a layer thickness changes with the widths of the strip growth regions.

15 Claims, 2 Drawing Sheets

(51) Int. Cl.
*H01L 31/0352* (2006.01)
*H01L 31/102* (2006.01)
*H01L 33/00* (2010.01)

(52) U.S. Cl.
CPC .. *H01L 31/0352* (2013.01); *H01L 31/035236* (2013.01); *H01L 31/102* (2013.01); *H01L 31/18* (2013.01); *H01L 33/00* (2013.01); *Y02P 70/50* (2015.11)

(56) References Cited

U.S. PATENT DOCUMENTS

| | | | |
|---|---|---|---|
| 2008/0283821 A1 | 11/2008 | Park | |
| 2013/0112939 A1* | 5/2013 | Chen | C30B 25/183 257/15 |
| 2015/0001556 A1* | 1/2015 | Kim | H01L 21/02433 428/141 |
| 2017/0092485 A1* | 3/2017 | Brueck | H01L 21/0243 |
| 2017/0194476 A1* | 7/2017 | Brueck | H01L 21/02494 |

* cited by examiner

DETECTOR MATERIAL AND PREPARATION METHOD THEREOF

CROSS REFERENCE TO RELATED APPLICATION

The present application is a national stage application of International Patent Application No. PCT/CN2022/130475, filed on Nov. 8, 2022, which claims priority to the Chinese Patent Application No. 202111658225.2, filed with the China National Intellectual Property Administration (CNIPA) on Dec. 30, 2021, and entitled "DETECTOR MATERIAL AND PREPARATION METHOD THEREOF", which is incorporated herein by reference in its entirety.

TECHNICAL FIELD

The present disclosure relates to the technical field of new materials, and in particular, to a detector material and a preparation method thereof.

BACKGROUND

A photodetector is a semiconductor device that can convert the collected optical signals into measurable electrical signals and acts as the "eyes" of the device. In the electronic equipment used in modern war, the infrared thermal imaging technology plays an important role in improving night vision, air defense and reconnaissance capabilities. In order to meet the military applications such as night vision, fire control, reconnaissance, surveillance, precision guidance and photoelectric countermeasures, it is necessary to use large-size, high-uniformity, unrefrigerated, wide-spectrum and multi-color detectors working in various infrared bands. This puts forward new and higher requirements for infrared detectors and their materials. It is necessary to improve the performance of the original detector materials and develop new materials to achieve a wide-spectrum multi-color high-performance detector, so as to make the detection information more rich, more accurate and reliable, to obtain the "color" image of the to-be-measured object, and improve the ability to identify the to-be-measured target.

The multi-color infrared detector can acquire the characteristic information of the detected target in multiple bands. The multi-color detector has the detection ability to identify different colors and wavelengths, which can provide more information about the measured object. The multi-color photodetector has the advantages of higher efficiency, stronger target identification ability, lower false alarm rate and higher spatial resolution. Most of the existing infrared imaging systems are monochromatic detectors, which are not suitable for accurate temperature measurement and reliable identification of targets with unknown specific emissivity. At present, the traditional multi-color detector is formed by the combination of detectors of different bands. Each device requires an independent imaging optical path, and the need to assemble a filter leads to complex system, low detection efficiency, large volume, and cost-ineffectiveness.

SUMMARY

An objective of the present disclosure is to overcome the deficiencies in the prior art, and provide a detector material and a preparation method thereof. The preparation method of the present disclosure can obtain detector materials with continuous changes in composition or layer thickness, which is of great significance for improving device performance and realizing wide-spectrum and multi-color detectors.

To achieve the above objective, the present disclosure provides the following technical solutions:

The present disclosure further provides a preparation method of a detector material, including the following steps:

(1) growing a gallium compound on a surface of a substrate to obtain a buffer layer substrate;

(2) depositing silicon dioxide on a buffer layer surface of the buffer layer substrate to obtain a silicon dioxide film substrate;

(3) conducting photolithography and etching on a silicon dioxide film surface of the silicon dioxide film substrate sequentially to obtain a strip growth layer substrate; and (4) growing a quantum well or superlattice on a strip growth layer surface of the strip growth layer substrate to obtain the detector material.

Preferably, the substrate in step (1) is a gallium arsenide substrate. The gallium compound is gallium arsenide or gallium antimonide.

Preferably, in step (1), the gallium compound is grown at 560-600° C. and 0.5-1 ML/s.

Preferably, in step (1), the buffer layer substrate has a buffer layer thickness of 90-110 nm.

Preferably, in step (2), the silicon dioxide is deposited at a pressure of 100-150 Pa, radio-frequency (RF) power of 140-160 W, and a temperature of 280-320° C.

A silicon dioxide film deposited has a thickness of 30-40 nm.

Preferably, in step (3), the photolithography is conducted at an ultraviolet (UV) wavelength of 360-370 nm and an exposure dose of 15-20 mW/cm$^2$ for an exposure time of 5-7 s.

The etching is conducted with an etching solution containing hydrogen fluoride, ammonium fluoride and water with a volume ratio of (0.8-1.2):(1.8-2.2):(2.8-3.2) at 9-10 nm/s for 4-5 s.

Preferably, in step (3), the strip growth layer surface is provided with the strip growth regions, and the widths of the strip growth regions increase sequentially.

Each of the strip growth regions has a width of 1-100 μm, and the widths increase at an amplitude of 0.1-0.8 μm.

Preferably, in step (4), the quantum well is an In$_x$GaAs/GaAs quantum well, and the superlattice is an InAs/GaSb superlattice.

Preferably, in step (4), the quantum well or superlattice is grown under an In beam with an intensity of 7.6-7.8×10$^{-8}$ Torr and a Ga beam with an intensity of 1.3-1.5×10$^{-7}$ Torr with a V/III beam ratio of 5.5-6.5 at 520-540° C.

The present disclosure further provides a detector material obtained by the preparation method according to the above technical solution.

The present disclosure provides a preparation method of a detector material. The present disclosure epitaxially grows a GaAs or GaSb buffer layer on a surface of a GaAs substrate as a seed layer of the detector material, deposits an SiO$_2$ layer on the GaAs or GaSb buffer layer, and etches the SiO$_2$ layer on the GaAs or GaSb buffer layer according to a strip pattern by photolithography and etching to form strip growth regions with continuous changes in width. Finally, a molecular beam epitaxy (MBE) technology is used to epitaxially grow an In$_x$GaAs/GaAs quantum well or an InAs/GaSb superlattice in the strip growth regions under set epitaxy growth conditions. Because of a same mobility of atoms arriving at the surface of the substrate, numbers of atoms migrating to the strip growth regions are different due to different widths of the strip growth regions, such that compositions of the $In_xGaAs$ material change with the widths of the strip growth regions or a layer thickness in the InAs/GaSb superlattice structure changes with the widths of the strip growth regions. The preparation method of a semiconductor material provided by the present disclosure solves the problem that the continuous changes in composition or layer thickness cannot be realized in the two-dimensional plane during the epitaxial growth of traditional semiconductor materials, so as to effectively solve the problem that the multi-color and wide-spectrum detectors require high-quality detector materials at the present stage, and obtain semiconductor materials with continuous changes in composition or superlattice layer thickness, which provides high quality materials for the multi-color and wide-spectrum detectors, and promotes development and application of the multi-color and wide-spectrum detectors.

DETAILED DESCRIPTION OF THE EMBODIMENTS

Figure 1:
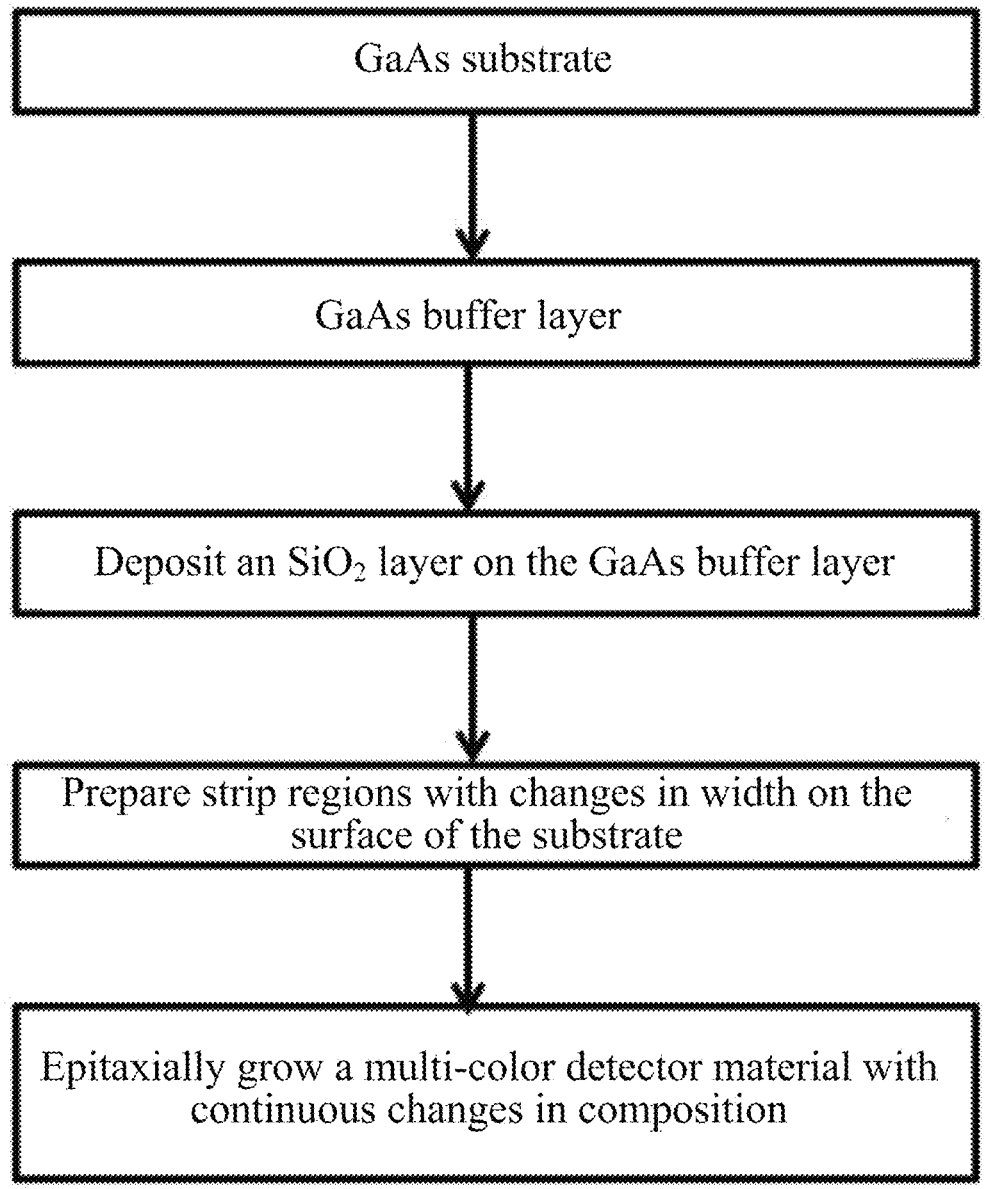
FIG. 1 is a schematic diagram of a preparation process of Example 1.

The present disclosure further provides a preparation method of a detector material, including the following steps.
(1) A gallium compound is grown on a surface of a substrate to obtain a buffer layer substrate.
(2) Silicon dioxide is deposited on a buffer layer surface of the buffer layer substrate to obtain a silicon dioxide film substrate.
(3) Photolithography and etching are conducted on a silicon dioxide film surface of the silicon dioxide film substrate sequentially to obtain a strip growth layer substrate.
(4) A quantum well or superlattice is grown on a strip growth layer surface of the strip growth layer substrate to obtain the detector material.
In the present disclosure, the substrate in step (1) is preferably a gallium arsenide substrate. The gallium compound is preferably gallium arsenide or gallium antimonide.
In the present disclosure, the gallium arsenide substrate is subjected to surface cleaning before the gallium compound is grown, and the surface cleaning is preferably sequential soaking, ultrasonic treatment, washing and drying. The soaking is conducted with a soaking solution preferably containing hydrogen fluoride, ammonium fluoride and water with a volume ratio of preferably (0.8-1.2):(1.8-2.2):(2.8-3.2), further preferably (0.9-1.1):(1.9-2.1):(2.9-3.1), and more preferably (0.95-1.05):(1.95-2.05):(2.95-3.05), for 60-180 s, further preferably 80-160 s, and more preferably 100-140 s. The oxide layer can be removed from the surface of the substrate through soaking.
In the present disclosure, ultrasonic treatment is conducted at a frequency of preferably KHz, further preferably 90-160 KHz, and more preferably 110-140 KHz, for preferably min, further preferably 11-14 min, and more preferably 12-13 min.
In the present disclosure, the washing reagent is preferably deionized water, the drying method is preferably air drying, and the air drying gas is preferably nitrogen, argon or neon.
In an example of the present disclosure, the gallium compound is grown on the surface of the cleaned substrate by MBE equipment, and an obtained buffer layer is taken as a seed layer for epitaxial growth of the detector material.
In the present disclosure, in step (1), the gallium compound is grown at preferably 560-600° C., further preferably 570-590° C., and more preferably 575-585° C., at preferably 0.5-1 ML/s, further preferably 0.6-0.9 ML/s, and more preferably 0.7-0.8 ML/s.
In the present disclosure, in step (1), the buffer layer substrate has a buffer layer thickness of preferably 90-110 nm, further preferably 95-105 nm, and more preferably 98-102 nm.
In the present disclosure, the silicon dioxide is deposited on the epitaxial buffer layer preferably using plasma enhanced chemical vapor deposition (PECVD) to obtain the silicon dioxide film substrate.
In the present disclosure, in step (2), the silicon dioxide is deposited at a pressure of preferably 100-150 Pa, further preferably 110-140 Pa, and more preferably 120-130 Pa, RF power of preferably 140-160 W, further preferably 145-155 W, and more preferably 148-152 W, and a temperature of 280-320° C., further preferably 290-310° C., and more preferably 295-305° C.
In the present disclosure, the deposition method is preferably gas deposition, and the gas deposition is conducted with gas preferably containing silane, oxygen and argon. A gas flow rate of the silane is preferably 120-160 sccm, further preferably 130-150 sccm, and more preferably 135-145 sccm. A gas flow rate of the oxygen is preferably 15-25 sccm, further preferably 16-24 sccm, and more preferably 18-22 sccm. A gas flow rate of the argon is preferably 80-120 sccm, further preferably 90-110 sccm, and more preferably 95-105 sccm.
In the present disclosure, the silicon dioxide film has a thickness of preferably 30-40 nm, further preferably 32-38 nm, and more preferably 34-36 nm.
In the present disclosure, photolithography and etching are conducted on a silicon dioxide film surface sequentially to obtain a strip growth layer substrate.
In the present disclosure, in step (3), the strip growth layer surface is provided with the strip growth regions, and the widths of the strip growth regions increase sequentially.
In the present disclosure, each of the strip growth regions has a width of preferably 1-100 μm, further preferably 20-80 μm, and more preferably 40-60 μm. The strip growth regions are at an interval of preferably 0.4-0.6 μm, further preferably 0.45-0.55 μm, and more preferably The widths increase at an amplitude of 0.1-0.8 μm, further preferably 0.2-0.6 μm, more preferably 0.3-0.5 μm, and also preferably 0.4 μm.
In the present disclosure, a layer of positive photoresist with a thickness of preferably 580-620 nm, further preferably 590-610 nm, and more preferably 595-605 nm is spun on the silicon dioxide film surface at preferably 3,800-4,200 rpm/s, further preferably 3,900-4,100 rpm/s, and more preferably 3,950-4,050 rpm/s. The substrate containing the photoresist is heated at preferably 85-95° C., further preferably 86-94° C., and more preferably 88-92° C., for preferably 50-70 s, further preferably 55-65 s, and more preferably 58-62 s. After heating, exposure is conducted using a UV lithography machine.

In the present disclosure, in step (3), the photolithography is conducted at a UV wavelength of preferably 360-370 nm, further preferably 362-368 nm, and more preferably 364-366 nm, and an exposure dose of preferably 15-20 mW/cm$^2$, further preferably 16-19 mW/cm$^2$, and more preferably 17-18 mW/cm$^2$, for an exposure time of preferably 5-7 s, further preferably 5.5-6.5 s, and more preferably 5.8-6.2 s.

In the present disclosure, the substrate is heated and hard baked at preferably 100-110° C., further preferably 102-108° C., and more preferably 104-106° C., for preferably 100-140 s, further preferably 110-130 s, and more preferably 115-125 s. After heating and hard baking, the substrate is placed in a developing solution for development to complete photolithography for preferably 15-20 s, further preferably 16-19 s, and more preferably 17-18 s. There is no special requirement for the developing solution. After photolithography, strip growth regions with continuous changes in width are formed on the surface of the substrate for further etching.

In the present disclosure, the etching is conducted with an etching solution preferably containing hydrogen fluoride, ammonium fluoride and water with a volume ratio of preferably (0.8-1.2):(1.8-2.2):(2.8-3.2), further preferably (0.9-1.1):(1.9-2.1):(2.9-3.1), and more preferably (0.95-1.05):(1.95-2.05):(2.95-3.05), at preferably 9-10 nm/s, further preferably 9.2-9.8 nm/s, and more preferably 9.4-9.6 nm/s, for preferably 4-5 s, further preferably 4.2-4.8 s, and more preferably 4.4-4.6 s.

In the present disclosure, the silicon dioxide film in the strip growth region is etched away by etching. After the etching, the substrate is soaked in acetone to remove the photoresist that has not been subjected to photolithography on the surface. The soaking is conducted for preferably 2-5 h, further preferably 3-4 h, and more preferably 3.3-3.7 h. After soaking, the substrate is cleaned with anhydrous ethanol and water sequentially to obtain a strip growth layer substrate.

In the present disclosure, in step (4), the quantum well is preferably an In$_x$GaAs/GaAs quantum well, and the superlattice is preferably an InAs/GaSb superlattice.

In the present disclosure, in step (4), the quantum well or superlattice is grown under an In beam with an intensity of preferably 7.6-7.8×10$^{-8}$ Torr, further preferably 7.65-7.75×10$^{-8}$ Torr, and more preferably 7.68-7.72×10$^{-8}$ Torr, and a Ga beam with an intensity of preferably 1.3-1.5×10$^{-7}$ Torr, further preferably 1.35-1.45×10$^{-7}$ Torr, and more preferably 1.38-1.42×10$^{-7}$ Torr, with a V/III beam ratio of preferably 5.5-6.5, further preferably 5.6-6.4, and more preferably 5.8-6.2, at preferably 520-540° C., further preferably 525-535° C., and more preferably 528-532° C.

In the present disclosure, the strip growth layer substrate is placed in the MBE equipment, and the growth parameters, V/III ratio and beam parameters of the respective sources are set. The In source, Ga source and As source furnace baffles are opened at the same time to grow the In$_x$GaAs ternary alloy material. The Ga source and As source furnace baffles are opened at the same time to grow the GaAs material. Finally, the In$_x$GaAs/GaAs quantum well multi-color detector material with continuous changes in composition is completed on the substrate.

In the present disclosure, the strip growth layer substrate is placed in the MBE equipment, and the growth parameters, the V/III ratio during epitaxial growth of the InAs and GaSb film layers and beam parameters of the respective sources are set. The In source and As source furnace baffles are opened at the same time to grow the InAs film layer. The Ga source and Sb source furnace baffles are opened at the same time to grow the GaSb film layer. Finally, the InAs/GaSb superlattice wide-spectrum detector material with continuous changes in thickness in the superlattice structure is prepared on the substrate.

The present disclosure further provides a detector material obtained by the preparation method.

The technical solutions provided by the present disclosure will be described in detail below with reference to examples, but the examples should not be construed as limiting the claimed scope of the present disclosure.

Example 1

A gallium arsenide substrate was soaked in a soaking solution for 120 s. Hydrogen fluoride, ammonium fluoride and water in the soaking solution had a volume ratio of 1:2:3. After soaking, the substrate was taken out and subjected to ultrasonic treatment for 12 min at a frequency of 100 KHz. The substrate was fully washed with deionized water and dried with nitrogen.

The substrate was placed in MBE equipment, the growth temperature was controlled to be 580° C. and the rate was 0.6 ML/s. A 100 nm GaAs buffer layer was grown as a seed layer for epitaxy growth of a detector material.

Silicon dioxide was deposited on the buffer layer substrate using PECVD. The pressure was controlled to be 120 Pa, the RF power was 150 W, and the temperature was 300° C. A gas flow rate of the silane was 140 sccm, a gas flow rate of the oxygen was 20 sccm, and a gas flow rate of the argon was 100 sccm. A silicon dioxide film with a thickness of 35 nm was obtained.

A layer of photoresist with a thickness of 600 nm was spun on the silicon dioxide film surface at 4,000 rpm/s. The substrate was heated at 90° C. for 60 s. The exposure was completed by controlling the UV wavelength to be 365 nm, an exposure dose to be 18 mW/cm2, and an exposure time to be 6 s. The substrate was heated and hard baked at 105° C. for 120 s, and placed in a developing solution for 20 s to complete the photolithography. After the photolithography, the strip growth regions were at an interval of 0.5 μm, the narrowest strip growth region has a width of 10 μm, and the widths of the strip growth regions increase at an amplitude of 0.4 μm in sequence. The substrate was soaked in an etching solution for 5 s, the etching rate was controlled to be 9 nm/s, and hydrogen fluoride, ammonium fluoride and water in the etching solution had a volume ratio of 1:2:3. The silicon dioxide film in the strip growth region was etched away by etching. After the etching, the substrate was soaked in acetone for 4 h to remove the photoresist that had not been subjected to photolithography on the surface. After soaking, the substrate was cleaned with anhydrous ethanol and water sequentially to obtain a strip growth layer substrate.

The strip growth layer substrate was placed in the MBE equipment. The water vapor and impurities on the surface of the GaAs substrate were removed initially in the sample chamber and buffer chamber, and the GaAs substrate was transferred to the growth chamber of the MBE equipment. The growth temperature was adjusted to 530° C., the In beam intensity was 7.8×10$^{-8}$ Torr, the Ga beam intensity was 1.4×10$^{-7}$ Torr, and the V/III beam ratio was 6. The In source, Ga source and As source furnace baffles were opened at the same time to grow the In$_x$GaAs ternary alloy material. The Ga source and As source furnace baffles were opened at the same time to grow the GaAs material. Finally, the In$_x$GaAs/

GaAs quantum well multi-color detector material with continuous changes in composition was prepared on the substrate.

Figure 2:
FIG. 2 shows a schematic structural diagram of a detector material prepared by Example 1.
Figure 3:
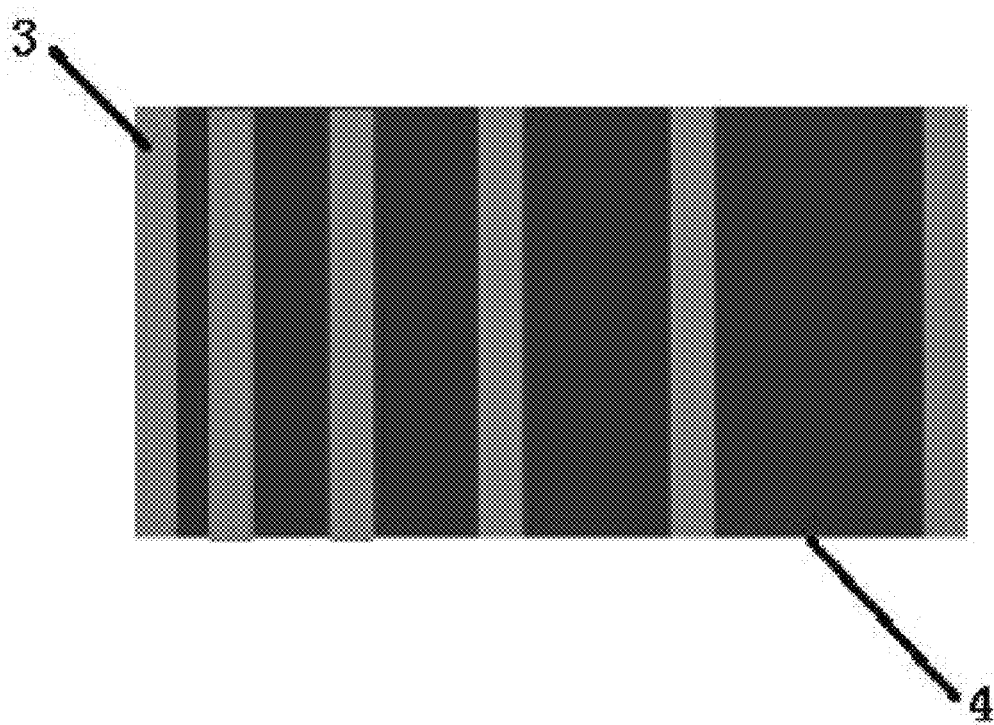
FIG. 3 shows a schematic diagram of an upper surface of the detector material prepared by Example 1.
Reference numerals in FIG. 2 to FIG. 3: 1, gallium arsenide substrate, 2, buffer layer, 3, silicon dioxide film, and 4, strip growth region and film material in strip growth region.

A schematic diagram of a preparation process of this example is shown in FIG. 1. A schematic diagram of a structure of a detector material prepared by this example is shown in FIG. 2. In FIG. 2, 1 denotes a gallium arsenide substrate, 2 denotes a buffer layer, 3 denotes a silicon dioxide film, and 4 denotes a strip growth region and a film material in the strip growth region. FIG. 3 shows a schematic diagram of an upper surface of the detector material prepared by this example. In FIG. 3, 3 denotes a silicon dioxide film, and 4 denotes a strip growth region and a film material in the strip growth region.

Example 2

A gallium arsenide substrate was soaked in a soaking solution for 180 s. Hydrogen fluoride, ammonium fluoride and water in the soaking solution had a volume ratio of 0.9:2.2:2.8. After soaking, the substrate was taken out and subjected to ultrasonic treatment for 10 min at a frequency of 130 KHz. The substrate was fully washed with deionized water and dried with nitrogen.

The substrate was placed in MBE equipment, the growth temperature was controlled to be 570° C. and the rate was 0.8 ML/s. An 80 nm GaSb buffer layer was grown as a seed layer for epitaxy growth of a detector material.

Silicon dioxide was deposited on the buffer layer substrate using PECVD. The pressure was controlled to be 140 Pa, the RF power was 160 W, and the temperature was 290° C. A gas flow rate of the silane was 150 sccm, a gas flow rate of the oxygen was 23 sccm, and a gas flow rate of the argon was 95 sccm. A silicon dioxide film with a thickness of 40 nm was obtained.

A layer of photoresist with a thickness of 620 nm was spun on the silicon dioxide film surface at 4,200 rpm/s. The substrate was heated at 95° C. for 70 s. The exposure was completed by controlling the UV wavelength to be 370 nm, an exposure dose to be 20 mW/cm$^2$, and an exposure time to be 7 s. The substrate was heated and hard baked at 110° C. for 130 s, and placed in a developing solution for 15 s to complete the photolithography. After the photolithography, the strip growth regions were at an interval of 0.6 µm, the narrowest strip growth region has a width of 20 µm, and the widths of the strip growth regions increase at an amplitude of 0.6 µm in sequence. The substrate was soaked in an etching solution for 5 s, the etching rate was controlled to be 10 nm/s, and hydrogen fluoride, ammonium fluoride and water in the etching solution had a volume ratio of 1:2:3. The silicon dioxide film in the strip growth region was etched away by etching. After the etching, the substrate was soaked in acetone for 5 h to remove the photoresist that had not been subjected to photolithography on the surface. After soaking, the substrate was cleaned with anhydrous ethanol and water sequentially to obtain a strip growth layer substrate.

The strip growth layer substrate was placed in the MBE equipment. The water vapor and impurities on the surface of the GaAs substrate were removed initially in the sample chamber and buffer chamber, and the GaAs substrate was transferred to the growth chamber of the MBE equipment. The growth temperature was adjusted to 540° C., the In beam intensity was $7.7 \times 10^{-8}$ Torr, the Ga beam intensity was $1.3 \times 10^{-7}$ Torr, and the V/III beam ratio was 6.3. The In source and As source furnace baffles were opened at the same time to grow the InAs film layer. The Ga source and Sb source furnace baffles were opened at the same time to grow the GaSb film layer. Finally, the InAs/GaSb superlattice wide-spectrum detector material with continuous changes in thickness in the superlattice structure was prepared on the substrate.

From the above examples, the present disclosure provides a preparation method of a detector material. The present disclosure epitaxially grows a GaAs or GaSb buffer layer on a surface of a GaAs substrate as a seed layer of the detector material, deposits an SiO$_2$ layer on the GaAs or GaSb buffer layer, and etches the SiO$_2$ layer on the GaAs or GaSb buffer layer according to a strip pattern by photolithography and etching to form strip growth regions with continuous changes in width. Finally, an MBE technology is used to epitaxially grow an In$_x$GaAs/GaAs quantum well or InAs/GaSb superlattice detector material in the strip growth regions under set epitaxy growth conditions. The method provided by the present disclosure effectively solves the problem that the multi-color and wide-spectrum detector requires high-quality quantum well materials with continuous changes in composition or superlattice detector materials with continuous changes in layer thickness.

The above descriptions are merely preferred implementations of the present disclosure. It should be noted that those of ordinary skill in the art may further make several improvements and modifications without departing from the principle of the present disclosure, but such improvements and modifications should be deemed as falling within the protection scope of the present disclosure.

What is claimed is:

1. A preparation method of a detector material, comprising the following steps:
   (1) growing a gallium compound on a surface of an initial substrate to obtain a buffer layer, wherein the initial substrate is a gallium arsenide substrate; and the gallium compound is gallium arsenide or gallium antimonide;
   (2) depositing silicon dioxide on a surface of the buffer layer to obtain a silicon dioxide film;
   (3) conducting photolithography and etching on the silicon dioxide film sequentially to obtain a strip growth layer, wherein widths of strip growth regions of the strip growth layer change continuously; and
   (4) growing a quantum well or superlattice on the strip growth layer to obtain the detector material, wherein the quantum well is an In$_x$GaAs/GaAs quantum well, and the superlattice is an InAs/GaSb superlattice.

2. The preparation method according to claim 1, wherein in step (1), the gallium compound is grown at 560-600° C. and 0.5-1 ML/s.

3. The preparation method according to claim 2, wherein in step (1), the buffer layer has a thickness of 90-110 nm.

4. The preparation method according to claim 2, wherein in step (1), the gallium compound is grown on the surface of the initial substrate by molecular beam epitaxy (MBE) equipment.

5. The preparation method according to claim 1, wherein in step (2), the silicon dioxide is deposited at a pressure of 100-150 Pa, radio-frequency (RF) power of 140-160 W, and a temperature of 280-320° C.; and
   the silicon dioxide film has a thickness of 30-40 nm.

6. The preparation method according to claim 1, wherein in step (2), the silicon dioxide is deposited on the buffer layer surface by gas deposition using plasma enhanced chemical vapor deposition (PECVD), and the gas deposition is conducted with gas containing silane, oxygen and argon.

7. The preparation method according to claim 6, wherein a gas flow rate of the silane is 120-160 sccm; a gas flow rate of the oxygen is 15-25 sccm; and a gas flow rate of the argon is 80-120 sccm.

8. The preparation method according to claim 1, wherein in step (3), the photolithography is conducted at an ultraviolet (UV) wavelength of 360-370 nm and an exposure dose of 15-20 mW/cm$^2$ for an exposure time of 5-7 s; and
    the etching is conducted with an etching solution containing hydrogen fluoride, ammonium fluoride and water with a volume ratio of (0.8-1.2):(1.8-2.2):(2.8-3.2) at 9-10 nm/s for 4-5 s.

9. The preparation method according to claim 8, wherein in step (3), the photolithography is as follows: spinning a layer of positive photoresist with a thickness of 580-620 nm on the silicon dioxide film at 3,800-4,200 rpm/s to obtain a photoresist-containing product;
    heating the photoresist-containing product at 85-95° C. for 50-70 s;
    conducting exposure using a UV lithography machine to obtain an exposed product;
    heating and hard baking the exposed product at 100-110° C. for 100-140 s to obtain an intermediate product; and
    placing the intermediate product in a developing solution for development for 15-20 s.

10. The preparation method according to claim 8, wherein in step (3), the strip growth layer surface is provided with the strip growth regions, and the widths of the strip growth regions increase sequentially; and
    each of the strip growth regions has a width of 1-100 μm, and the widths increase at an amplitude of 0.1-0.8 μm.

11. The preparation method according to claim 10, wherein the strip growth regions are at an interval of 0.4-0.6 μm.

12. The preparation method according to claim 11, wherein in step (4), the quantum well or superlattice is grown under an In beam with an intensity of $7.6\text{-}7.8\times10^{-8}$ Torr and a Ga beam with an intensity of $1.3\text{-}1.5\times10^{-7}$ Torr with a V/III beam ratio of 5.5-6.5 at 520-540° C.

13. The preparation method according to claim 1, wherein the gallium arsenide substrate is subjected to surface cleaning before the gallium compound is grown in step (1), and the surface cleaning is sequential soaking, ultrasonic treatment, washing and drying.

14. A detector material obtained by the preparation method according to claim 1.

15. The detector material according to claim 14, composed of an intial substrate (1), a buffer layer (2) growing on a surface of the initial substrate, a strip growth layer (3) deposited on a surface of the buffer layer, and a superlattice or quantum well (4) growing on the surface of the buffer layer not covered by the strip growth layer, wherein the strip growth layer is a silicon dioxide film.

\* \* \* \* \*